United States Patent [19]
Gullicksrud et al.

[11] Patent Number: 5,751,558
[45] Date of Patent: May 12, 1998

[54] DEVICE FOR IMPROVING COMPUTER CAGE SLOT KEYING

[75] Inventors: John Theodore Gullicksrud, Rochester; Dale Joseph Lidberg, Wabasha; Michael David Seyfert, Chatfield, all of Minn.

[73] Assignee: International Business Machines Corporation, Armonk, N.Y.

[21] Appl. No.: 610,038

[22] Filed: Mar. 4, 1996

[51] Int. Cl.$^6$ ...................................................... H05K 7/14
[52] U.S. Cl. ........................ 361/801; 361/740; 361/747; 361/752; 361/753; 361/759; 361/799; 439/377; 439/491; 211/41.17
[58] Field of Search ........................................ 361/726, 732, 361/740, 741, 747, 754, 756, 759, 786, 796, 798, 801, 802, 825; 292/87, 91; 211/41.17, 26.2, 184; 312/223.1, 223.2, 223.6; 439/491, 377, 64

[56] References Cited

U.S. PATENT DOCUMENTS 4,335,819  6/1982  Weisman et al. .................... 211/41

FOREIGN PATENT DOCUMENTS 1-199498  8/1989  Japan .
4-116891  4/1992  Japan .

OTHER PUBLICATIONS

"Implementation of Logic Book/Cage Keys", *IBM Technical Disclosure Bulletin*, vol. 33, No. 10B, Mar., 1991, pp. 235 241.

*Primary Examiner*—Leo P. Picard
*Assistant Examiner*—Phuong T. Vu
*Attorney, Agent, or Firm*—Felsman, Bradley, Gunter & Dillon

[57] ABSTRACT

A keyblock is shown for use in a computer cage having an interior and a guide rail for guiding a logic-card book into position within the interior. The keyblock is installed within a cage guide opening provided at an end of the guide rail within the cage interior by means of a downwardly projecting dart which is received within the opening in snap-fit fashion. Locating pins on the keyblock lower surface properly position and align the keyblock within the cage guide opening. Contoured regions on the keyblock upper surface engage and lead-in a complimentary surface located on the logic-card book being received within the cage interior. One or more slots provided between selected contoured regions provide a coded pattern which matches a pattern provided on the desired logic-card book to be received in a predetermined position within the cage interior.

10 Claims, 3 Drawing Sheets

DEVICE FOR IMPROVING COMPUTER CAGE SLOT KEYING

BACKGROUND OF THE INVENTION

1. Technical Field

The present invention relates generally to devices for assisting in the positioning of computer cards within a computer cage and, specifically, for assisting in the placement of logic-card books within a central electronics complex cage.

2. Description of the Related Art

A common method for implementing electronic circuits utilizes thin, generally rectangular printed circuit boards. Such boards mechanically support various components such as integrated circuit chips, resistors, capacitors and transistors as well as for providing one or more layers of electrical wiring.

A card cage is a box having at least one open side. On the side opposite the open side is typically positioned electrical connectors which are cooperatively positioned and shaped to allow insertion of an edge or portion of the edge of a card or a mating connector on the card to create an electrical connection to the circuitry on each card. The connectors are themselves electrically interconnected.

In other type of cage assemblies, referred to herein as Central Electronics Complexes (CEC), a logic cage is designed to accept "books" that contain the logic for the computer system. Each book consists of one or more logic cards with added covers which provide rails for guiding the assembly in to the cage. A mating rail and slot provided in a support surface or surfaces of the cage serve as a locating surface and as a guide to support side edges of the book as the book is positioned within the computer cage.

The logic-card books have electrical connectors that plug into a logic cage backplane wall or card and allow the transfer of power and logic signals through the system. The lack of uniformity of the connectors and lines going to the connectors may cause physical and/or electrical damage if a book is plugged into the wrong logic cage slot. Thus, it is desirable to uniquely "key" each book so that the book can only be inserted into a cage slot which is matched to the book connector type and electrical line location, thereby preventing damage to the book or to the cage from incorrect installation. Proper keying also prevents putting a book into a cage slot upside down, which could damage the connectors.

At the present time, CEC cages and logic-card books are keyed by providing key slots in the cage support surfaces and by providing key tabs on the logic-card books. The key slots are typically stamped into the sheet metal material of the cage, an operation which requires expensive tooling. Because each machined cage is of a fixed configuration, it is necessary to stock multiple cage configurations. Additionally, if an error is made in the assembly of the backplane to the cage, or if the cage needs to be reconfigured for any reason, the cage must be disassembled to change the keying scheme. Even where three key slots are machined per book position in the cage, there are only a limited number of book-slot combinations available and the available choices may exceed the available number of combinations. The keying difference from one cage to another is not easily visually obvious because of the location and design of the present key slots. The present design requires a close visual inspection to determine the configuration of a particular cage, thereby increasing the likelihood of an assembly error.

A need exists, therefore, for a simple method for keying each logic-card book so that it can only be inserted in the proper cage slot that is matched to the book connector type and electrical line location, which does not require expensive hard tooling and which can be simply and easily changed to reduce inventory requirements.

A need also exists for a simple keying scheme which allows a manufacturer to make and stock a single cage for all logic-card book configurations.

A need also exists for a simple generic cage design which does not require configuration of the keying until after a backplane panel is installed.

A need exists for a keying system which allows the keys to be removed individually without cage/board disassembly and reassembly.

A need also exists for a keying scheme which provides an easily recognized visual indication of the cage configuration.

A need also exists for a keying system which helps to prevent leakage of cooling air in or out of the cage.

A need exists for a keying scheme which provides support of a booked device in either a horizontal or vertical position within a computer cage.

These and other objects are accomplished by the apparatus of the present invention, as will be apparent from the written description which follows.

SUMMARY OF THE INVENTION

The apparatus of the invention is used with a computer cage of the type having an interior with at least one guide rail for guiding a logic-card book into position within the interior. The guide rail has opposing ends. At least one cage guide opening is located at a selected position along the guide rail. The apparatus of the invention includes a keyblock which is mountable within the cage guide opening. The keyblock has an upper surface and a lower surface. A mounting means is located on the keyblock lower surface for retaining the keyblock within the cage guide opening. Locating means are provided on the keyblock lower surface for locating and positioning the keyblock within the cage guide opening. A plurality of contoured regions on the keyblock upper surface engage and lead-in a complimentary surface located on the logic-card book being received within the cage interior.

Preferably, the cage guide opening is provided at a selected end of the guide rail and the mounting means is a downwardly extending dart. The downwardly extending dart is a flexible structure which allows the keyblock to be mounted within the cage guide opening in a snap-fit and removable fashion. The locating means on the keyblock lower surface can comprise a pair of spaced-apart pins which extend downwardly from the lower surface generally normal thereto. The locating pins are received within a pair of mating receptacle openings formed on either side of the cage guide opening. The contoured regions located on the keyblock upper surface preferably include an outwardly extending convex lip, a pair of spaced-apart side elements, and one or more centrally located tabs or partitions which are used to provide a selected number of slots for contacting and guiding the logic-card book into a desired position within the cage interior. The keyblocks can be color coded to assist in identifying a mating logic-card book.

The computer cage of the invention includes a cage body having an interior with at least one support surface therein for supporting a logic-card book within the interior. The support surface has a plurality of guide rails formed therein for guiding logic-card books into position within the interior. Each guide rail has opposing ends. The computer cage also has at least one cage guide opening located in the cage metal at a selected location along the guide rail.

A keyblock is located within at least selected ones of the cage guide openings provided. Each keyblock has an upper surface and a lower surface. A downwardly projecting dart is located on each keyblock lower surface for mounting the keyblock within the selected cage guide opening. A pair of locating pins on the keyblock lower surface locate the keyblock within the cage guide opening and are received within mating receptacle openings provided in the metal cage adjacent the cage guide opening. A plurality of contoured regions on the keyblock upper surface engage and lead-in a complimentary surface located on a logic-card book being received within the cage interior.

In the method of the invention, a logic-card book is installed within a computer cage interior by first installing a removable keyblock within at least a selected one of the cage guide openings formed at a selected location along the guide rails. The keyblock is coded to matingly accept the leading edge of the logic-card book being inserted. The keyblock is installed by temporarily deforming a downwardly extending dart on the keyblock lower surface, whereby the dart engages the cage guide opening in snap-fit fashion. A pair of locating pins on the keyblock lower surface are simultaneously received within mating receptacle openings provided in the metal cage, thereby centering the keyblock. The pins center or otherwise locate the keyblock and support the weight of a logic-card book when the cage is mounted horizontally. The dart holds the keyblock in place should the cage be mounted horizontally, instead of in the typical vertical orientation or be installed in the upper cage guide.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
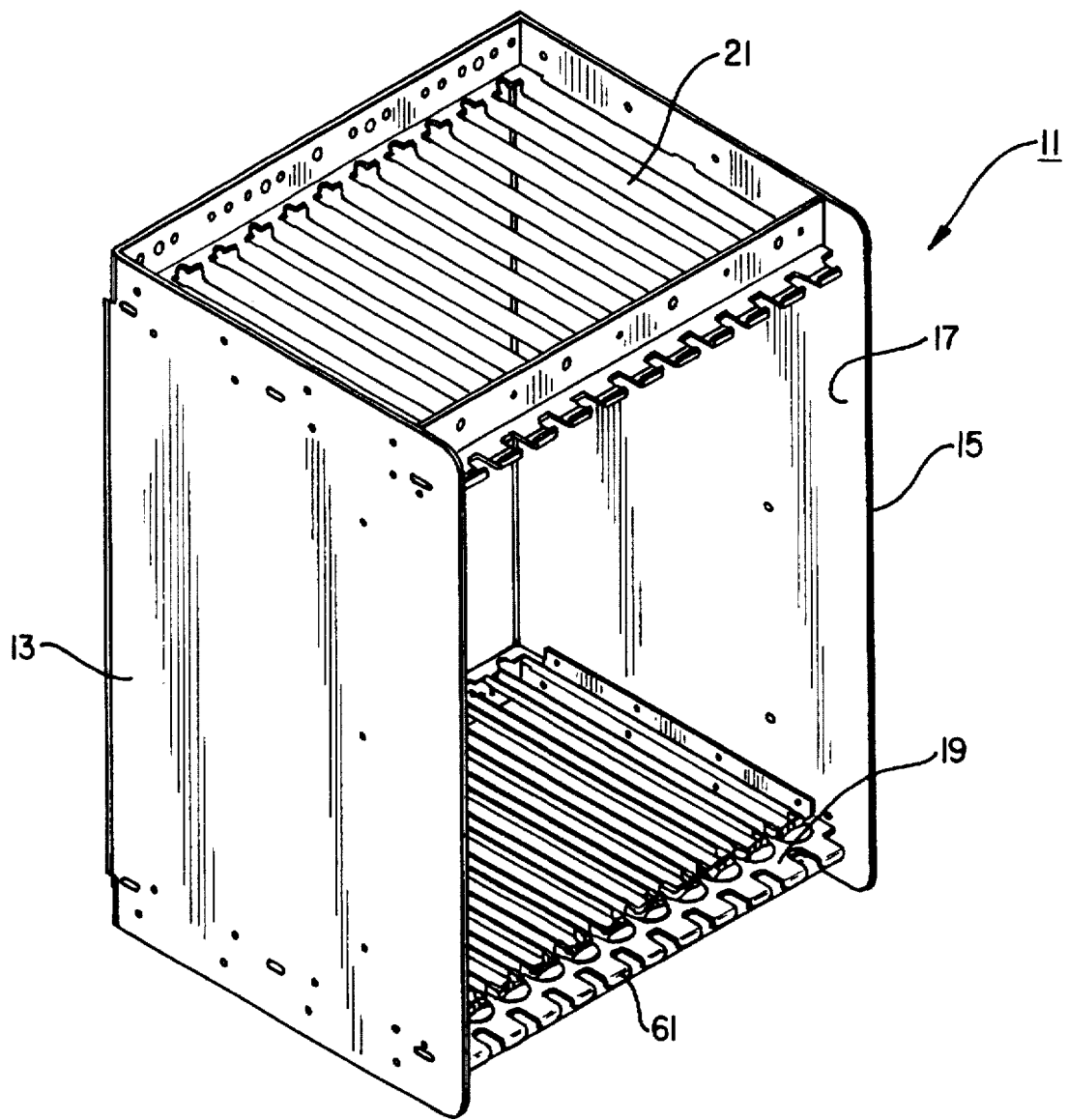
FIG. 1 is a perspective view of a computer cage of the type adapted to receive a logic-card book.

FIG. 1 shows a computer cage of the invention designated generally as 11. The computer cage 11 is basically a box having opposing sides 13, 15 and an initially open interior 17. At least one support surface 19 is provided for guiding and supporting a logic-card book within the interior 17. Preferably, opposing support surfaces 19, 21 are provided.

Figure 2:
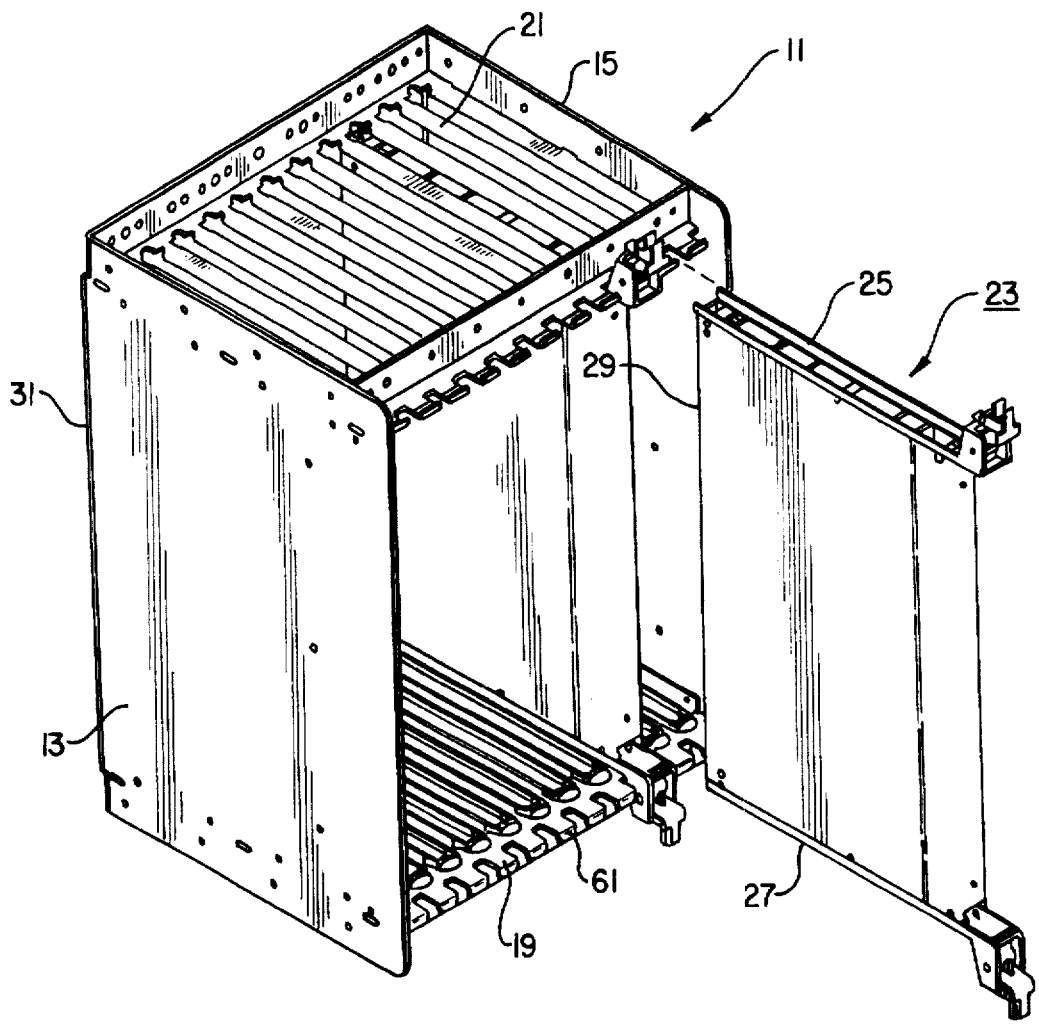
FIG. 2 is a perspective view of the computer cage showing the installation of a logic-card book within the rails of the book along mating guide rails formed in support surfaces of the computer cage.

FIG. 2 illustrates what will be referred to herein as a typical Central Electronics Complex (CEC) which consists of the computer cage 11 and one or more "books" 23 that contain the logic for the computer system. Each book 23 consists of a plurality of logic cards with covers which include upper and lower rails 25, 27 for guiding the logic-card book into the cage 11.

Figure 5:
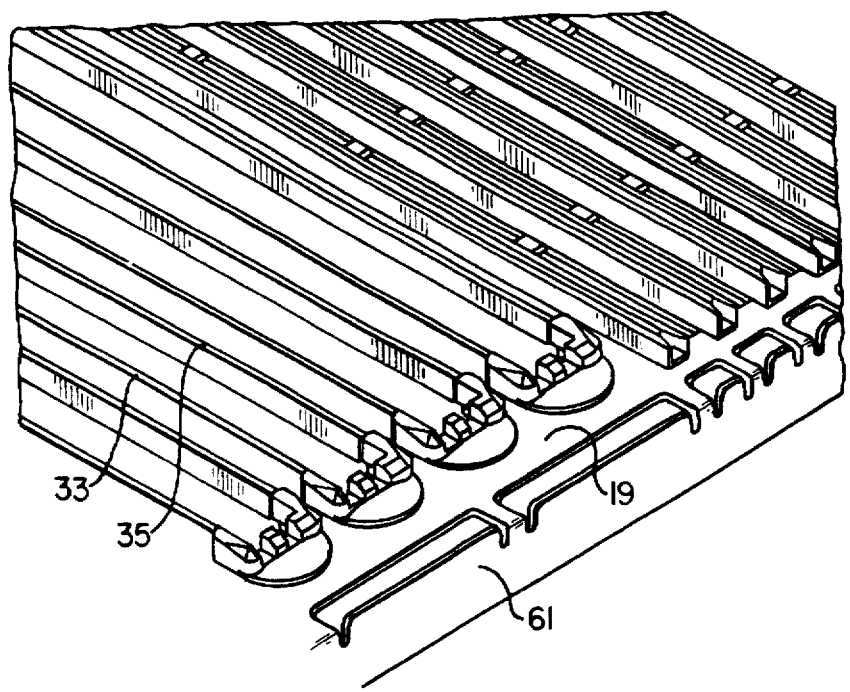
FIG. 5 is a partial, isolated view of the lower support surface of the computer cage of FIG. 1 showing a plurality of the keyblocks of the invention in place within the guide slot openings.
Figure 6:
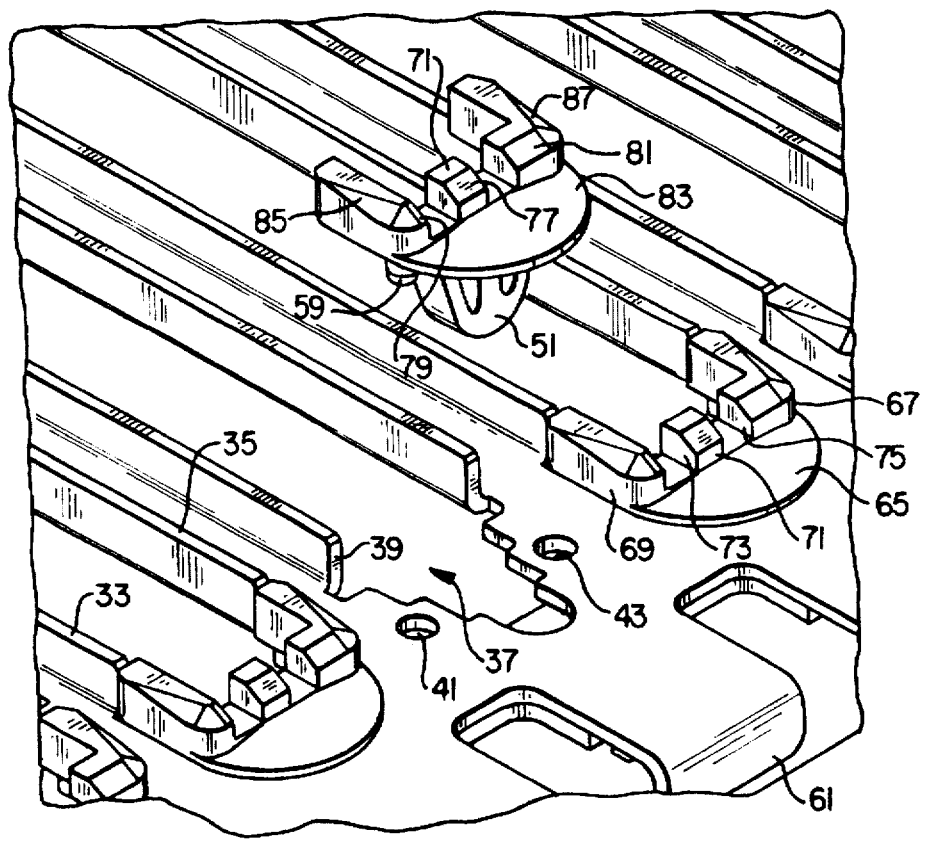
FIG. 6 is a close-up, isolated view, similar to FIG. 5, showing the installation of one of the keyblocks of the invention within the guide slot opening of the computer cage.

The books 23 have electrical connectors on a leading edge 29 thereof which plug into the computer cage backplane 31 and allow the transfer of power and logic signals throughout the system. As best seen in FIG. 5, the support surface 19 includes a plurality of spaced pairs of guide rails 33, 35 which are arranged in parallel fashion running from a front lip 61 in the direction of the backplane 31 just above the support surface 19. As shown in FIG. 6, a generic cage guide opening 37 is provided at a selected location along the guide rails. In the embodiment of FIG. 6, the opening 37 is provided at one of the opposing ends 39 of each paired guide rail. Additionally, a pair of receptacle openings 41, 43 are formed on either side of the cage guide opening 37.

Figure 3:
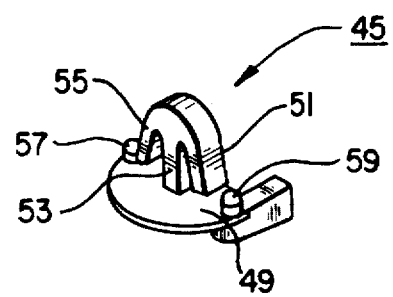
FIG. 3 is a perspective view of the keyblock of the invention showing the lower surfaces thereof.
Figure 4:
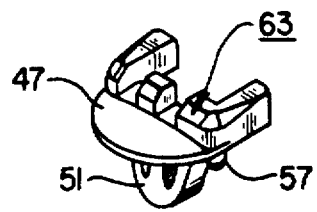
FIG. 4 is a view similar to FIG. 3 showing the upper surfaces of the keyblock of the invention.

FIG. 3 shows the keyblock of the invention, designated generally as 45. The keyblock 45 is adapted to be mounted within the cage guide opening (37 in FIG. 6) at a selected end 39 of the guide rail 33, 35. Alternatively, the keyblock 45 could be received within an appropriately sized opening located at some other point along the length of the guide rail 33. The preferred location is that shown in FIG. 6, however, for reasons which will become apparent. As shown in FIGS. 3 and 4, each keyblock 45 has an upper surface 47 and a lower surface 49. A mounting means, such as downwardly projecting dart (51 in FIG. 3), is located on the keyblock lower surface 49 for mounting the keyblock within the cage guide opening 37. The dart 51, in the embodiment of FIG. 3, is an arrow shaped element having an upright central portion 53 and an arcuate leading portion 55. While the keyblock 45 and dart 51 can be formed of cast (nonferrous materials), molded synthetic materials (plastics), or formed (ferrous materials), they are preferably molded from a flexible plastic material. Molding the devices from flexible plastic reduces cost and provides a convenient means for color coding each keyblock so that its associated logic-card book can be quickly and easily identified before installation and for verifying that the correct keyblock is located in the correct slot before book installation.

Also, although the keyblock 45 and guide rails 33, 35 are described as being separate components, it will be understood that the keyblocks and rails could be molded in one piece for insertion within an appropriately shaped opening in the cage support surface.

The flexible nature of the dart 51 allows the arcuate leading portion 55 to flex inwardly and outwardly as the keyblock is inserted within the guide opening 37, whereby the keyblock can be inserted or removed by hand pressure within the opening in snap-fit fashion. The keyblock can be removed by, for example, reaching underneath the support surface 19 and compressing the dart leading portion 51 or by inserting a screwdriver in the opening between portions 53, 55 and twisting the screwdriver to break-off the dart 51.

The keyblock 45 also has locating means on the lower surface 49 for locating the keyblock within the cage guide opening 37. Preferably, the locating means comprises a pair of spaced-apart pins 57, 59, which extend downwardly from the lower surface 49, as viewed in FIGS. 4 and 6, generally normal thereto. The locating pins 57, 59 are received within the mating receptacle openings 41, 43 formed adjacent the cage guide opening 37. In the embodiment of FIG. 6, the receptacle openings 41, 43 are equidistantly spaced on either side of the opening 37 and are arranged generally parallel to the front lip 61. As will be apparent, the receptacle openings and pins could be repositioned about the cage guide opening 37, as might be required. It is only necessary that the locating means locate the center block to center and support the weight of a book 23 should the cage be mounted horizontally, rather than in the vertical position illustrated in FIG. 2.

A plurality of contoured regions (63 in FIG. 4) are provided on the keyblock upper surface 47 for engaging and leading-in a complimentary surface located on the logic-card book 23 being received within the cage interior 17. Preferably, the contoured regions located on the keyblock upper surface 47 include an outwardly extending convex lip (65 in FIG. 6) and a pair of spaced-apart side elements 67, 69. In some cases, the keyblock may have no slots. However, it is generally preferable to have one or more centrally located tabs or partitions which are used to provide a selected number of slots for contacting and guiding the logic-card book into position. In the embodiment of FIG. 6, a center tab element 71 is located midway between the side elements 67, 69, thereby forming slots 73, 75. The outer surfaces of the side elements 67, 69 are used for locating the mating logic-card book rails. The slots 73, 75 provide a desired coding pattern for the keyblock, the coding pattern being matched to a mating pattern present on a complimentary surface on a preselected logic-card book desired to be received in a specific location within the cage interior. The slots thus limit or allow access to a complimentary feature present on the logic-card book to insure that the correct book is installed in the correct position within the cage interior. By providing none to multiple channels or slots, any number of key combinations can be made.

As shown in FIG. 6, the tab element 71 has a bevelled front face 77 while each side element 67, 69 has a front bevelled face 79, 81 each of these bevelled faces is cut at an angle which is generally complimentary to the slope of the convex lip 83 to provide a lead-in for the books as they are inserted into the cage. In prior designs, mating lead-in surfaces were formed into the sheet metal of the computer cage requiring expensive hard tooling. The removable keyblocks of the invention eliminate the need for expensive tooling. The side elements 67, 69 can also be further contoured by the addition of other bevelled surfaces 85, 87 to further facilitate the insertion of the logic-card book within the cage interior. As shown in FIGS. 1 and 6, once the keyblock is inserted within the cage guide opening the side elements engage the book complimentary surfaces to help prevent leakage of cooling air from between the cage guide and top and bottom of the logic-card books.

In the method of using the keyblock device of the invention, one or more removable keyblocks are positioned within the cage guide openings, such as opening 37 in FIG. 6 by snap-fitting the dart 51 within the opening 37 and locating the pins 57, 59 within the receptacle openings 41, 43. An identical or differently key coded keyblock (not shown) can also be inserted in the cage guide opening formed in the upper support surface (21 in FIG. 2) of the computer cage. A book 23 is then positioned within the computer cage by sliding the book rails 25, 27 over the contoured regions 63 of the keyblocks, whereby the book rails 25, 27 slide along the mating guide rails 33, 35 (FIG. 5) provided in the support surfaces. The book 23 slides along the rails 33, 35 until the front edge (29 in FIG. 2) or appropriately provided connectors contact and mate with the backplane 31, thereby making electrical connection between the book 23 and backplane.

An invention has been provided with several advantages. The keyblocks of the invention are simple in design and economical to manufacture and can be easily injection molded from a variety of flexible plastic materials which are commercially available in the marketplace. The removable nature of the keyblocks allows a single generic cage to be utilized, thereby reducing inventory requirements. The generic cage does not require keying until after the backpanel has been installed. If an error in keying is detected, the keys can be removed individually without cage/board disassembly and reassembly. The snap-in feature of the keyblock design facilitates installation and removal, if required. By color coding the keyblocks, keying errors are easily prevented or detected. The assembler can identify and quickly check the keying configuration at a glance. The design of the keyblocks and their contoured surfaces helps to prevent leakage of cooling air between the cage guide and the bottom and top of the logic-card books. The keyblock's locating pins provide lateral book support when the books are mounted in a horizontal position within the cage, and provide lateral book spacing when the books are mounted in a vertical position within the cage. Properly keying the computer cage prevents the installation of the logic-card book in the wrong slot or the installation of the book upside down. A number of slots allow a number of different key combinations. The new design eliminates expensive hard tooling which was required in the past to form the leading edge of the guide rails on the sheet metal of the computer cage. The convex lip provided as one of the contoured surfaces of the keyblock provides a visual indication of a lead-in for a book being installed. The lip also provides a functional lead-in surface for the book as it is being installed. The lip covers any tooling holes which may have been installed by the cage manufacturer to assist in making the cage guide openings. The lip is easier to handle and hold and facilitates installation of the keyblock within the cage guide opening. The additional bevelled edges assist in easy book insertion within the cage. The lip can either be hidden by an installed book or can be sized to extend from the assembly after book installation, thereby allowing the lip to be labelled or stamped with feature/slot numbers and to allow the visual matching of keys and books for quality review and other purposes.

While the invention has been particularly shown and described with reference to a preferred embodiment, it will be understood by those skilled in the art that various changes in form and detail may be made therein without departing from the spirit and scope of the invention.

What is claimed is:

1. An apparatus for use in computer cages of the type having an interior with at least one guide rail for guiding a logic-card book into position within the interior, the guide rail having opposing ends, the computer cage also having at least one cage guide opening provided at a selected location along the at least one guide rail, the apparatus comprising:

a keyblock mountable within the cage guide opening, the keyblock having an upper surface and a lower surface;

mounting means located on the keyblock lower surface for removably mounting and retaining the keyblock within the cage guide opening;

locating means on the keyblock lower surface for properly positioning the keyblock within the cage guide opening;

at least one contoured region on the keyblock upper surface for engaging and leading-in a complimentary surface located on the logic-card book being received within the cage interior;

and at least one slot provided on the keyblock upper surface for limiting or allowing access to a complimentary feature present on the logic-card book being received within the cage interior to thereby insure that the logic-card book is properly installed within the cage interior.

2. An apparatus for use in computer cages of the type having an interior with at least one guide rail for guiding a logic-card book into position within the interior, the guide rail having, opposing ends, the computer cage also having at least one cage guide opening located at a selected end of the at least one guide rail, the apparatus comprising:

a keyblock mountable within the cage guide opening at the selected end of the guide rail, the keyblock having an upper surface and a lower surface;

a downwardly projecting dart located on the keyblock lower surface for mounting the keyblock within the cage guide opening;

locating means on the keyblock lower surface for properly positioning the keyblock within the cage guide opening;

a plurality of contoured regions on the keyblock upper surface for engaging and leading-in a complimentary surface located on the logic-card book being received within the cage interior; and at least one slot provided on the keyblock upper surface for limiting or allowing access to a complimentary feature present on the logic-card book being received within the cage interior to thereby insure that the logic-card book is properly installed within the cage interior.

3. The apparatus of claim 2, wherein the downwardly projecting dart is a flexible structure which allows the keyblock to be mounted within the cage guide opening in snap-fit fashion.

4. The apparatus of claim 3, wherein the locating means on the keyblock lower surface comprises a pair of spaced-apart pins which extend downwardly from the lower surface generally normal thereto, the locating pins being received within a pair of mating receptacle openings formed on either side of the cage guide opening.

5. The apparatus of claim 4, wherein the contoured regions located on the keyblock upper surface include an outwardly extending convex lip and a pair of spaced-apart side elements, each side element having at least one bevelled contact surface for contacting and guiding the logic-card book into a desired position within the cage interior.

6. The apparatus of claim 5, wherein the keyblock is color coded for use with a preselected logic-card book.

7. An apparatus for use in metal computer cages of the type having an interior with a plurality of generic guide rails for guiding logic-card books into position within the interior, each of the generic guide rails having opposing ends, the computer cage also having at least one cage guide opening located in the cage metal at a selected end of each of the generic guide rails, the apparatus comprising:

a keyblock, formed of a flexible, synthetic material, mountable within at least selected cage guide openings at the end of a guide rail, each keyblock having an upper surface and a lower surface;

a downwardly projecting dart located on each keyblock lower surface for mounting the keyblock within the cage guide opening in snap-fit fashion;

a pair of locating pins projecting downwardly from each keyblock lower surface for locating the keyblock within the respective cage guide opening;

a plurality of contoured regions on each keyblock upper surface for engaging and leading-in a complimentary surface located on the logic-card book being received within the cage interior, the contoured regions including an outwardly extending convex lip and a pair of spaced-apart side elements, each side element having at least one bevelled contact surface for contacting and guiding the logic-card book into a desired position within the cage interior; and at least one slot formed between the pair of spaced-apart side elements for limiting or allowing access to a complimentary feature present on the logic-card block being received within the cage interior.

8. A computer cage, comprising:

a metal cage body having an interior with at least one support surface therein for supporting a logic-card book within the interior, the support surface having a plurality of guide rails formed therein for guiding logic-card books into position within the interior, each of the guide rails having opposing ends, the computer cage also having at least one cage guide opening located in the cage metal at a selected end of each of the guide rails;

a keyblock located within at least selected ones of the cage guide openings formed at the ends of the guide rails, each keyblock having an upper surface and a lower surface;

a downwardly projecting dart located on each keyblock lower surface for mounting the keyblock within the selected cage guide opening;

a pair of locating pins on the keyblock lower surface for locating the keyblock within the cage guide opening, the locating pins being received within mating receptacle openings provided in the metal cage adjacent the cage guide opening;

a plurality of contoured regions on the keyblock upper surface for engaging and leading-in a complimentary surface located on a logic-card book being received within the cage interior; and at least one slot formed between selected ones of the contoured regions on the keyblock upper surface which defines a desired coding pattern for the keyblock, the coding pattern being matched to a mating pattern present on a complimentary surface on a preselected logic-card book desired to be received in a specific location within the cage interior.

9. The computer cage of claim 8, wherein each downwardly projecting dart is a flexible structure which allows the keyblock to be mounted within the cage guide opening in snap-fit fashion.

10. The computer cage of claim 9, the contoured regions located on each keyblock upper surface includes an outwardly extending convex lip and a pair of spaced-apart side elements, each side element having at least one bevelled contact surface for contacting and guiding the logic-card book into a desired position within the cage interior.

* * * * *